United States Patent [19]
Kohyama

[11] Patent Number: 5,336,917
[45] Date of Patent: Aug. 9, 1994

[54] DYNAMIC MEMORY CELL USING HOLLOW POST SHAPE CHANNEL THIN-FILM TRANSISTOR

[75] Inventor: Yusuke Kohyama, Kawasaki, Japan

[73] Assignee: Kabushiki Kaisha Toshiba, Kawasaki, Japan

[21] Appl. No.: 985,951

[22] Filed: Dec. 4, 1992

[30] Foreign Application Priority Data

Dec. 6, 1991 [JP] Japan ................. 3-322629
Jun. 25, 1992 [JP] Japan ................. 4-167392
Nov. 20, 1992 [JP] Japan ................. 4-312031

[51] Int. Cl.$^5$ .............. H01L 29/68; H01L 29/10
[52] U.S. Cl. ................. 257/401; 257/296; 257/301; 257/329; 257/347
[58] Field of Search ........... 257/401, 296, 301, 302, 257/304, 329, 347

[56] References Cited

U.S. PATENT DOCUMENTS

| | | | |
|---|---|---|---|
| 4,630,088 | 12/1986 | Ogura et al. ............. | 357/23.6 |
| 4,673,962 | 6/1987 | Chatterjee et al. ........ | 257/302 |
| 4,974,060 | 11/1990 | Ogasawara ............... | 357/23.6 |
| 5,006,909 | 4/1991 | Kosa .................... | 257/302 |
| 5,166,762 | 11/1992 | Yoshida ................. | 257/401 |
| 5,225,701 | 7/1993 | Shimizu et al. .......... | 257/401 |

FOREIGN PATENT DOCUMENTS 0292371 12/1986 Japan ................. 257/329
2-198170 8/1990 Japan .
3-25972 2/1991 Japan .
4-14868 1/1992 Japan .

OTHER PUBLICATIONS

Japanese Patent Disclosure (KOKAI) No. 1-198065, M. Ogasawara (Aug. 9, 1989).

Primary Examiner—Mark V. Prenty
Attorney, Agent, or Firm—Banner, Birch, McKie & Beckett

[57] ABSTRACT

A semiconductor device comprises a first insulating layer, a gate electrode formed on the insulating layer, a second insulating layer formed on the gate electrode, an opening formed through the second insulating layer, the gate electrode and the first insulating layer, a gate insulating layer formed to overlay the inner surface of the opening, a monocrystalline silicon layer formed on the gate insulating layer within the opening to oppose the gate electrode, a monocrystalline silicon layer formed within the opening to make contact with the monocrystalline silicon layer and oppose the first insulating layer, and a monocrystalline silicon layer formed within the opening to make contact with the monocrystalline silicon layer and oppose the second insulating layer.

9 Claims, 19 Drawing Sheets

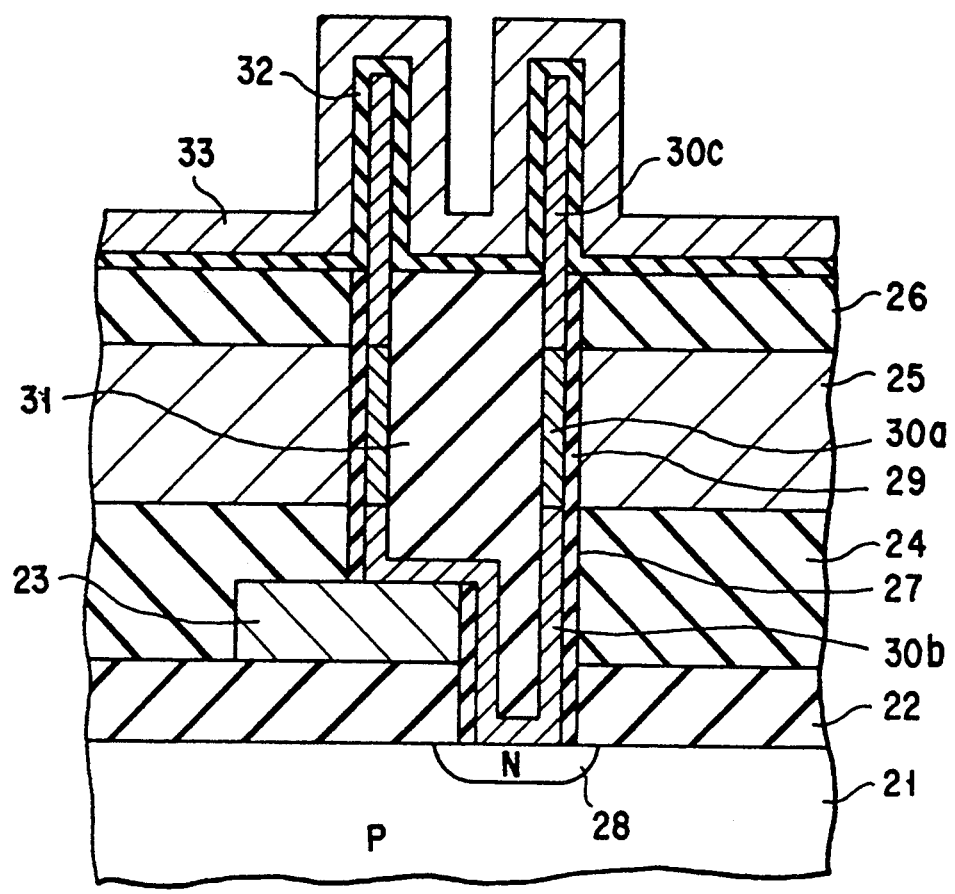
F I G. 1
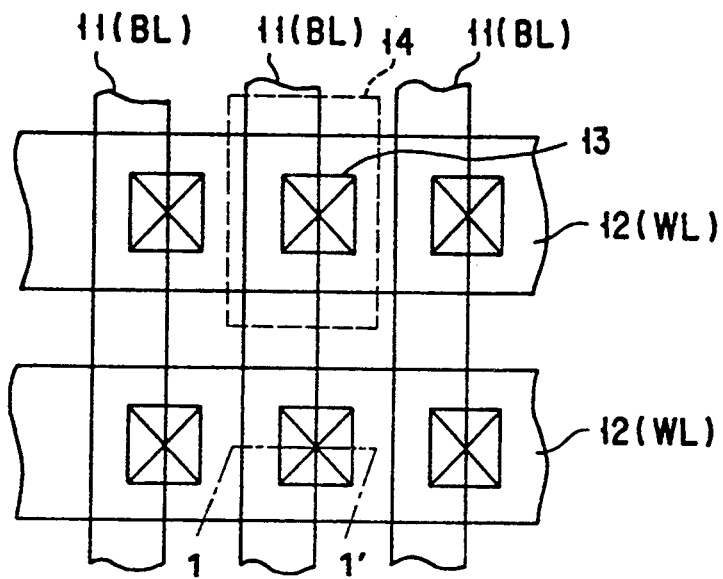
F I G. 2

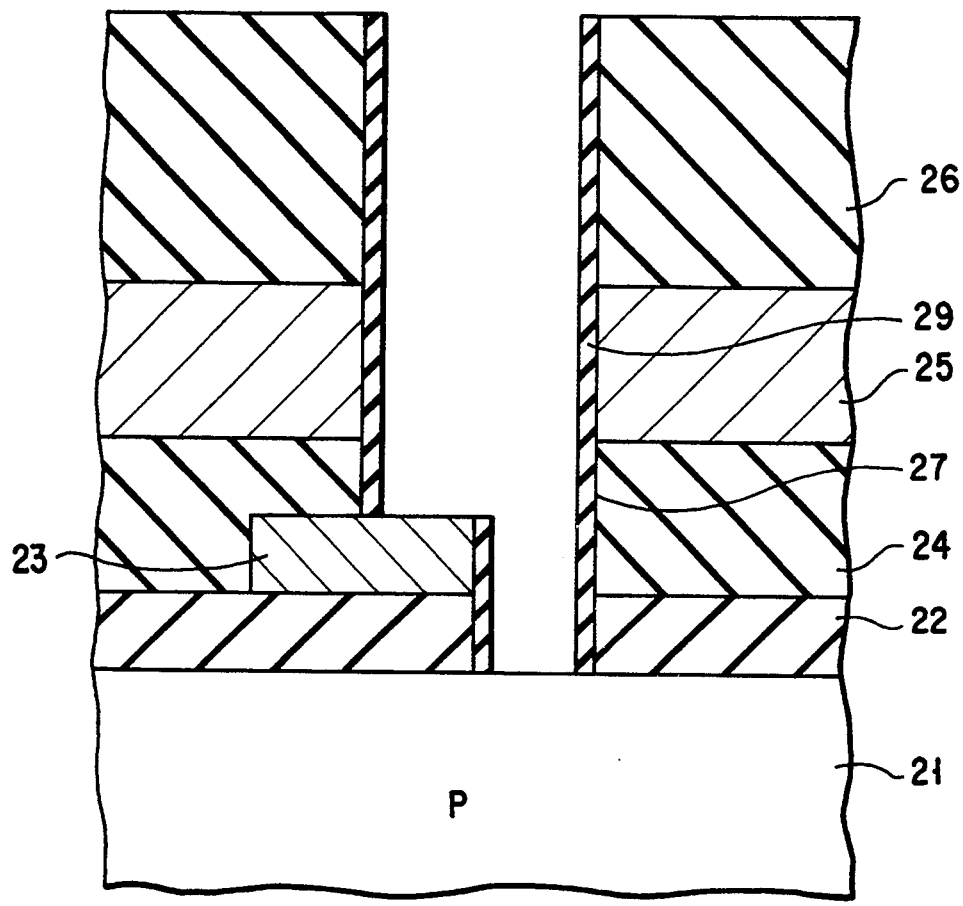
F I G. 5

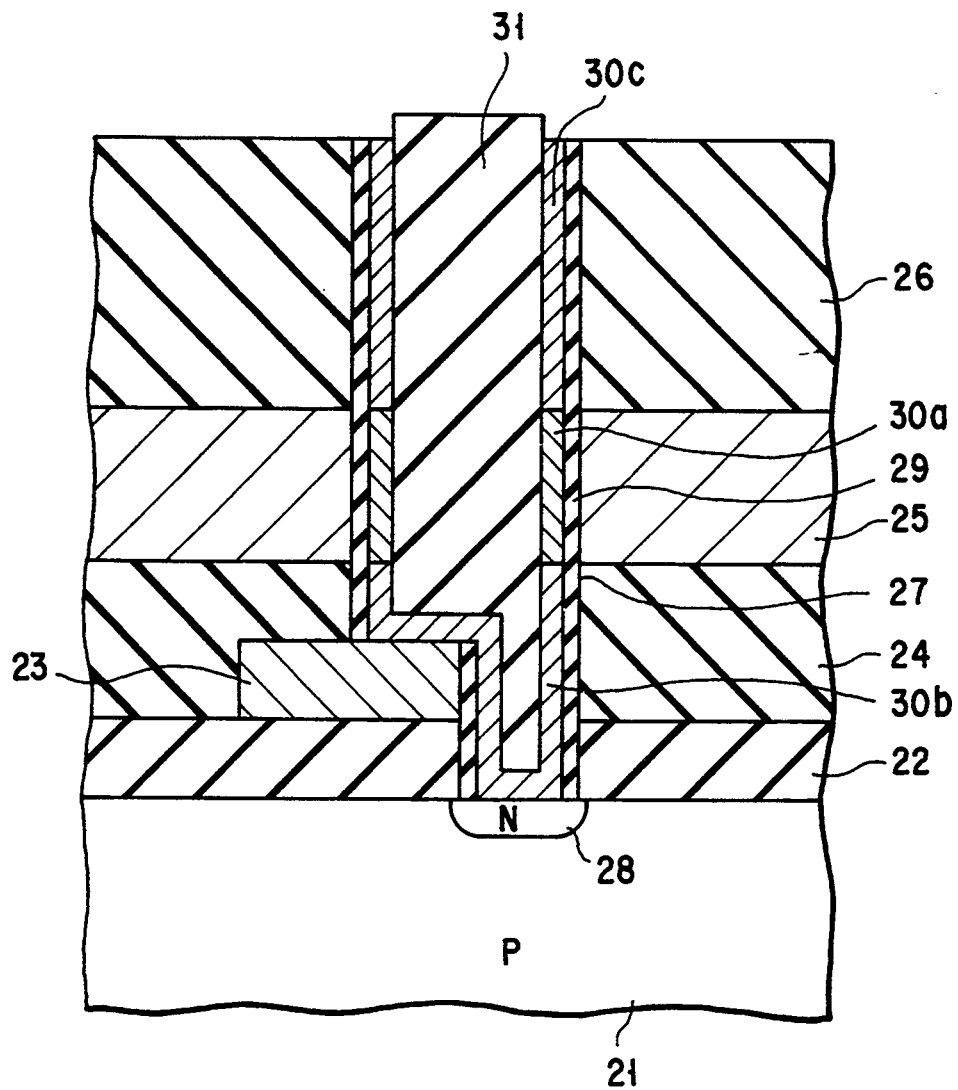
F I G. 7

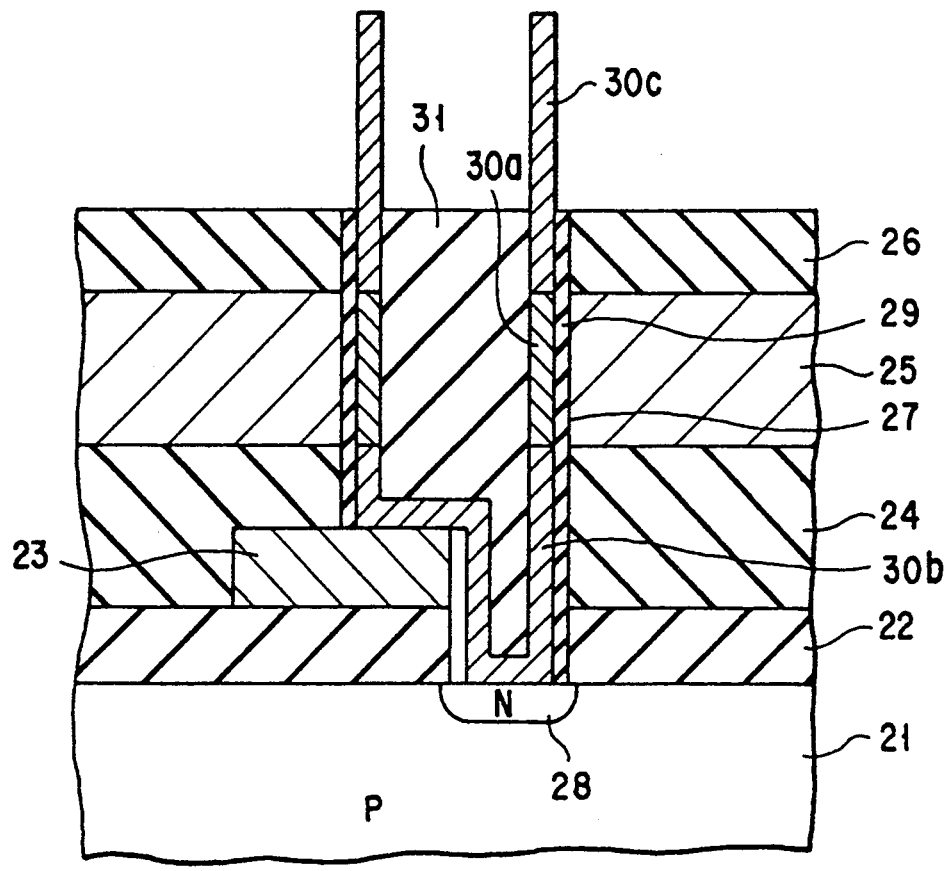
F I G. 8
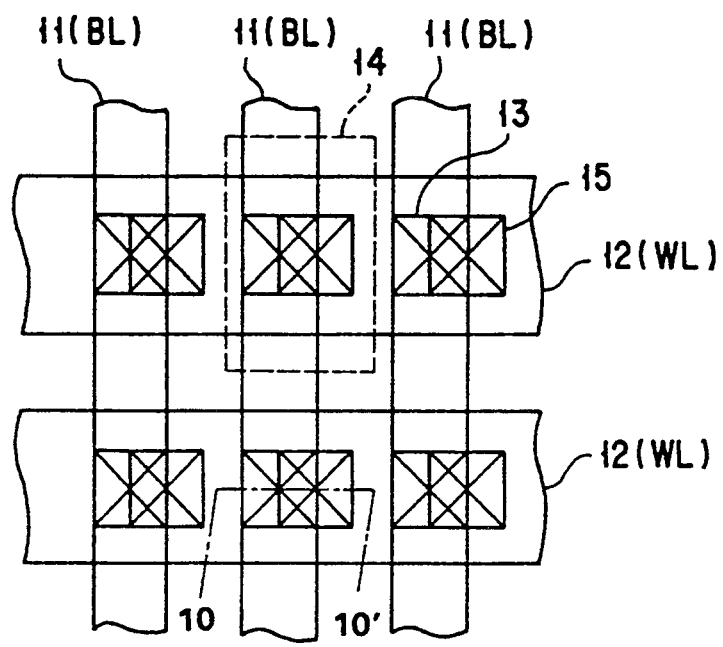
F I G. 9

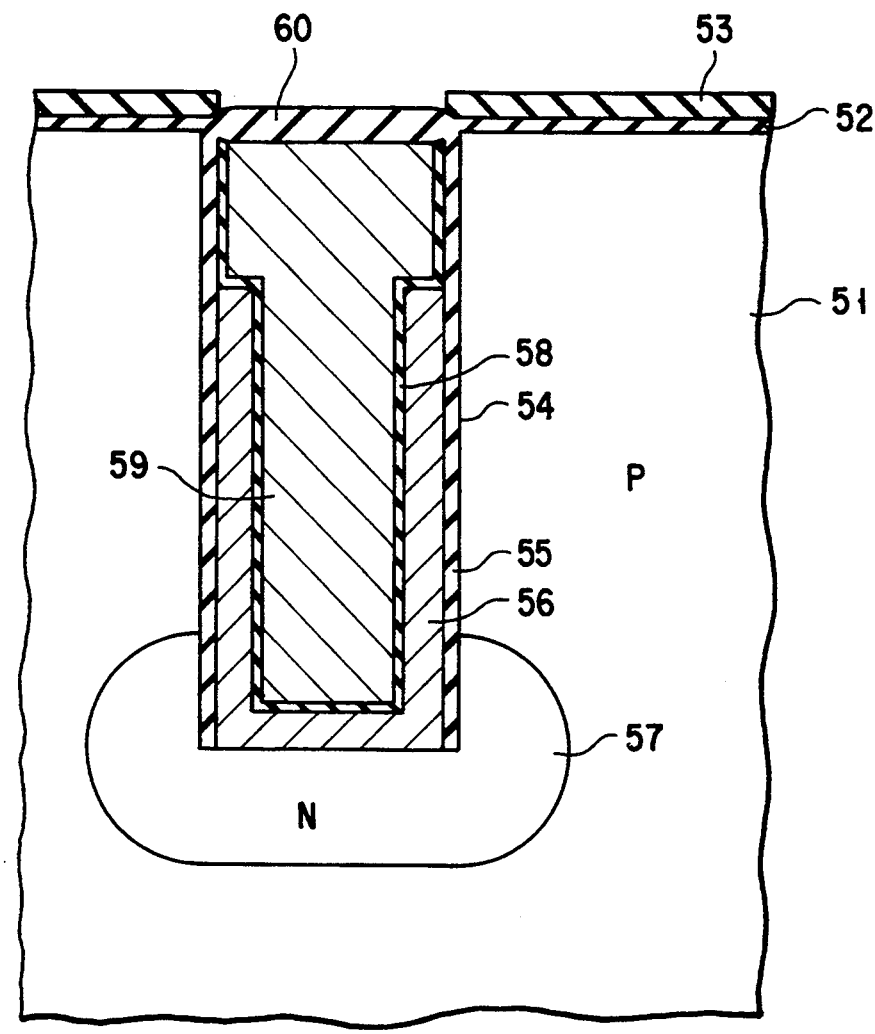
F I G. 10

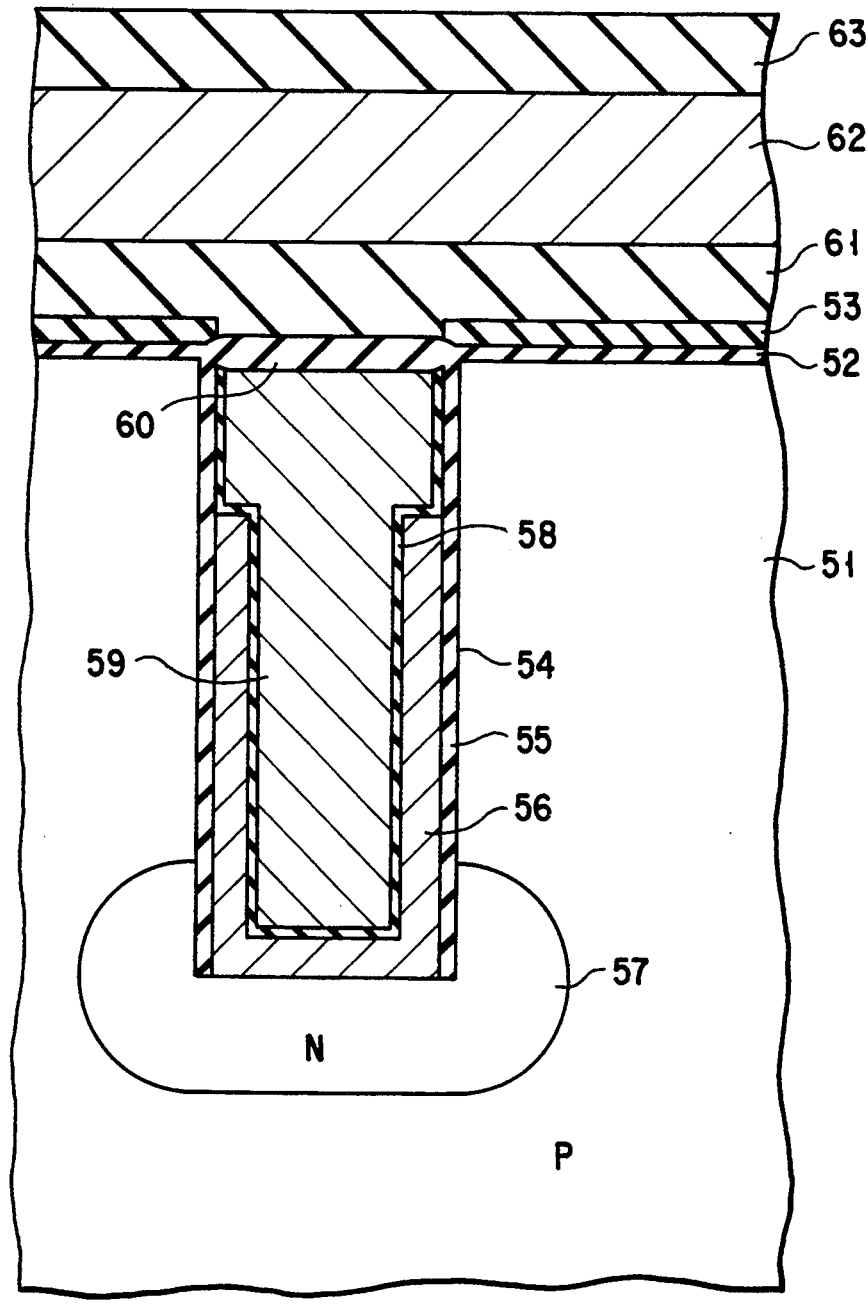
F I G. 11

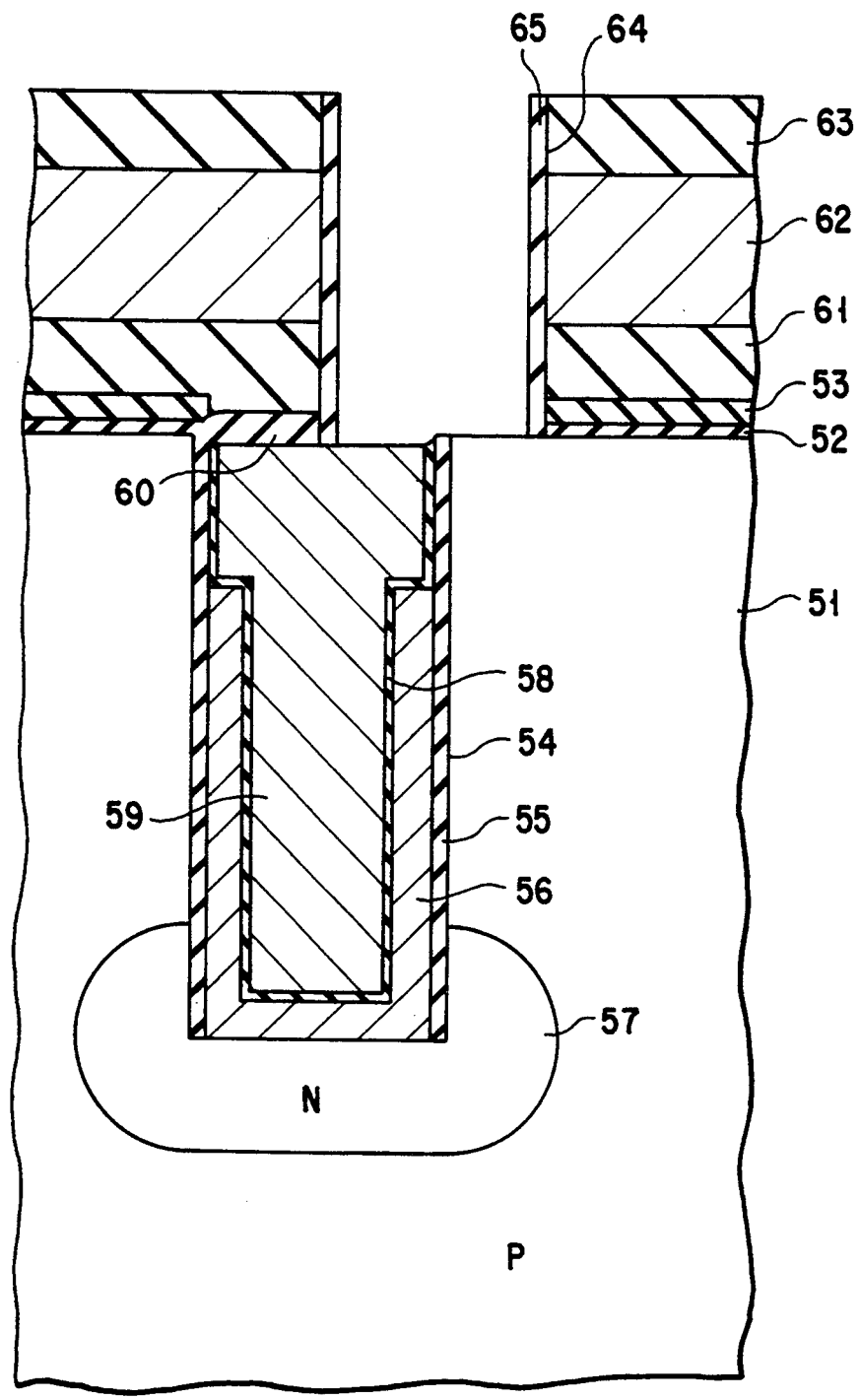
F I G. 12

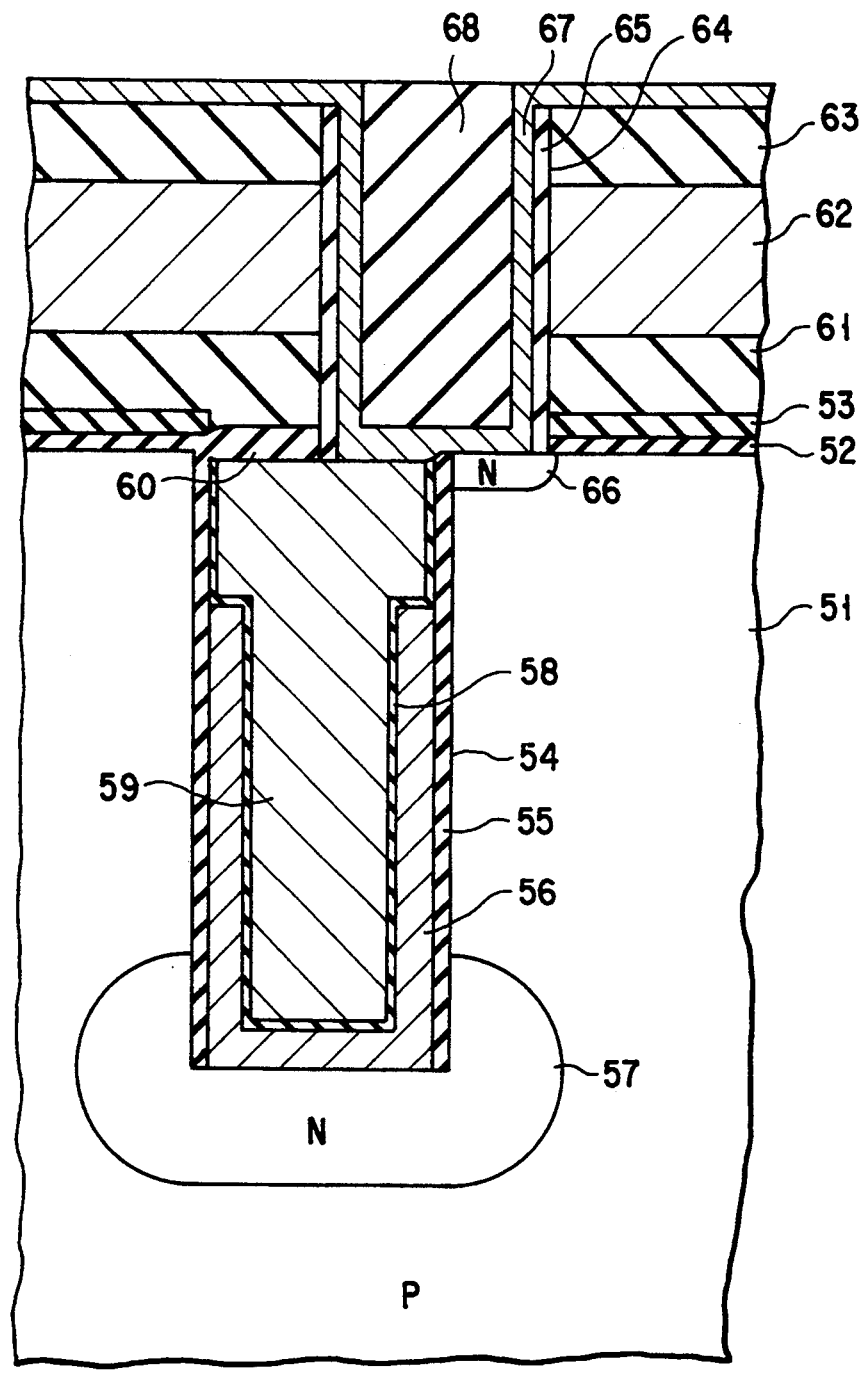
F I G. 13

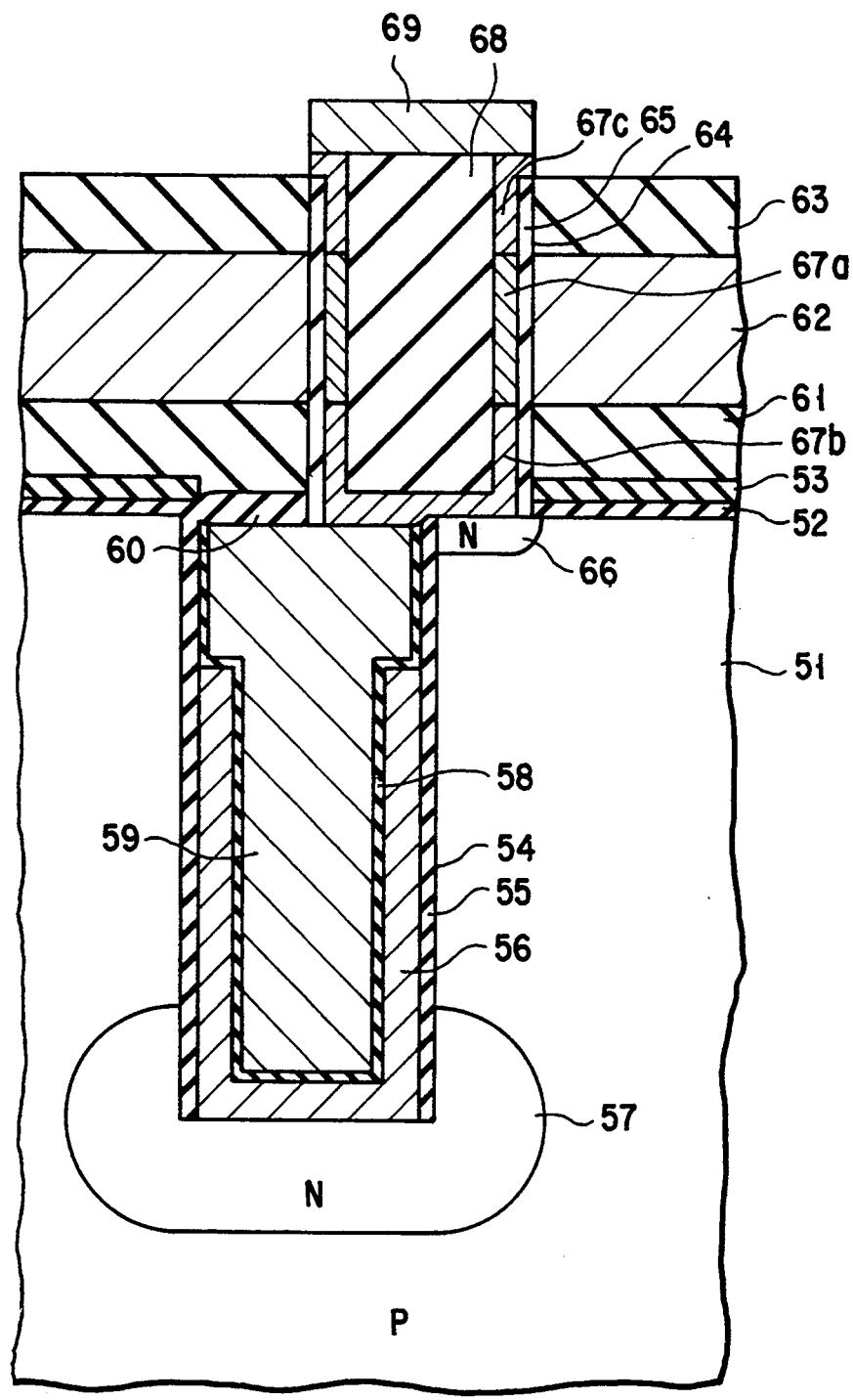
F I G. 14

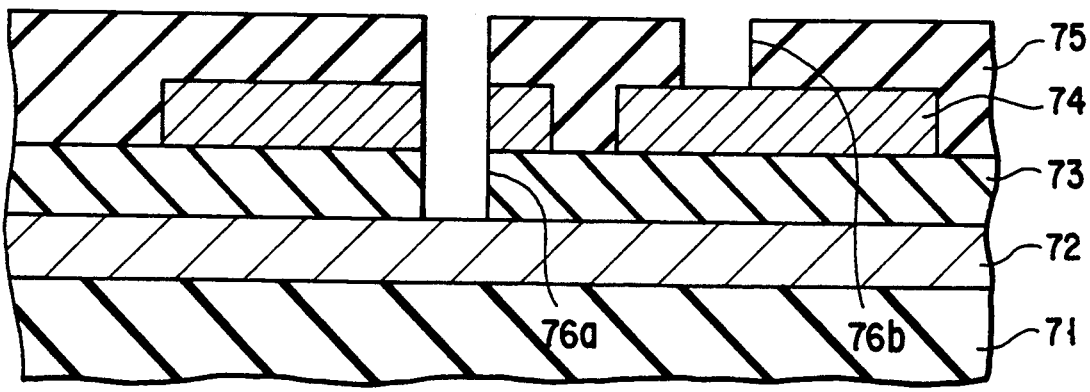
F I G. 17
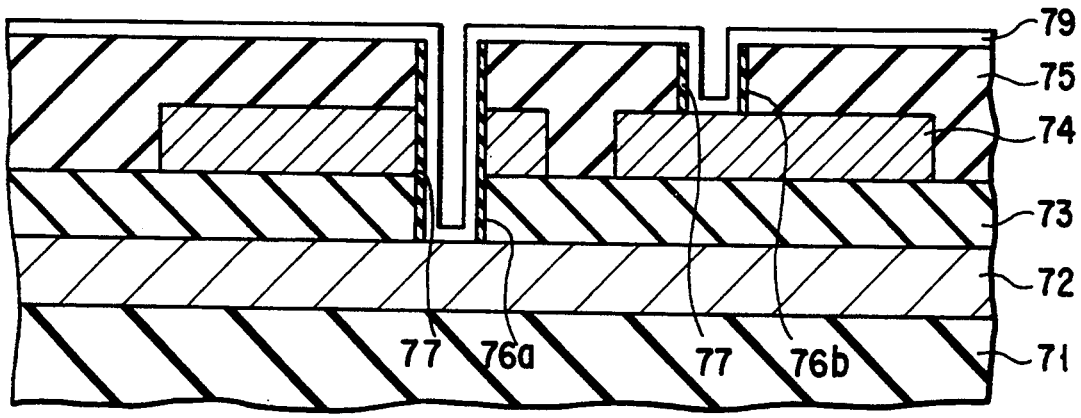
F I G. 18
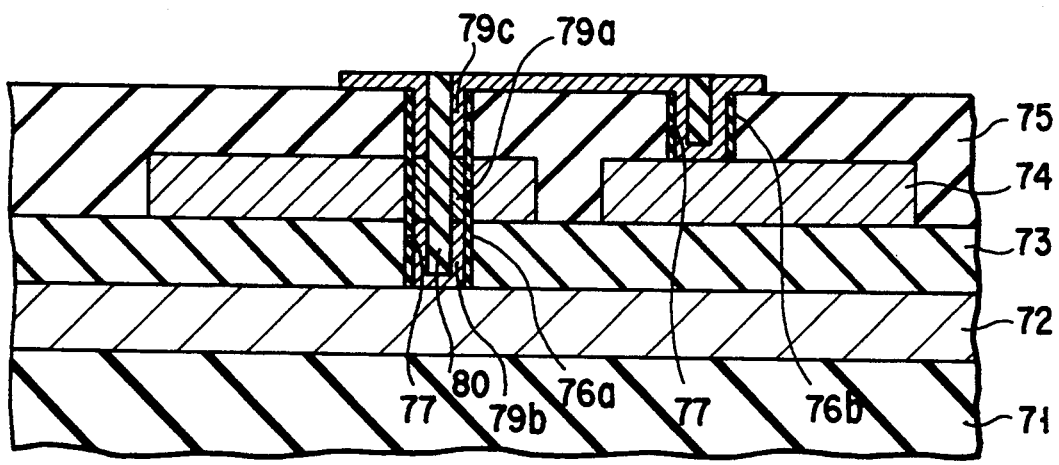
F I G. 19

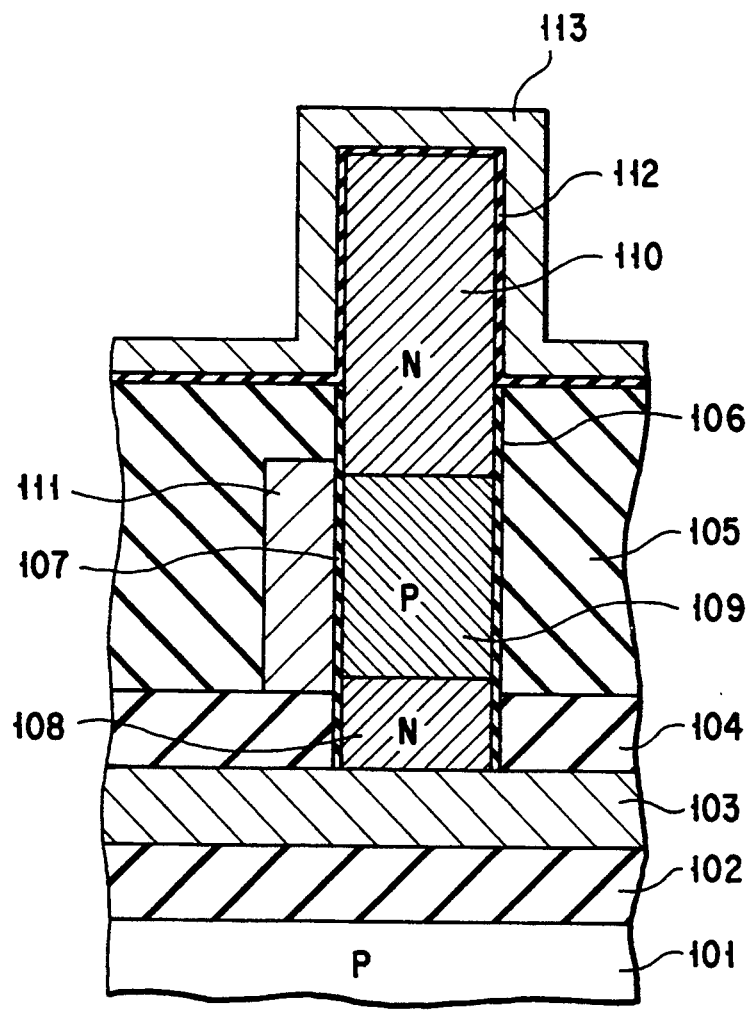
F I G. 23

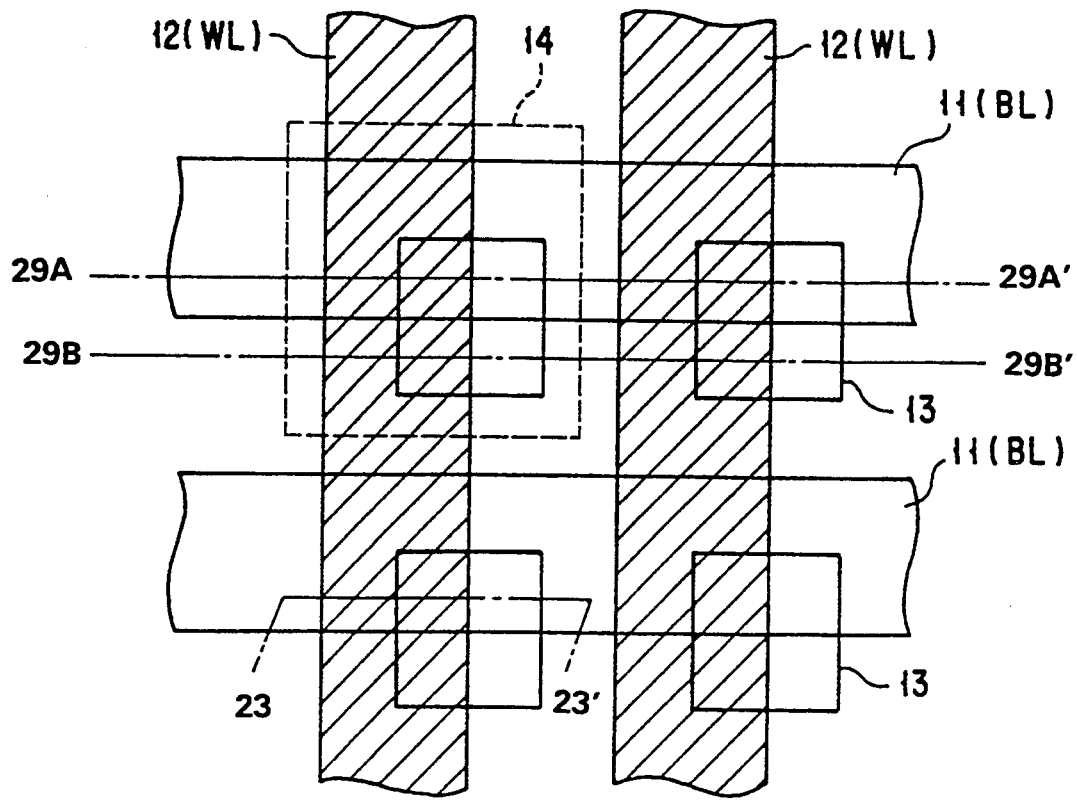
F I G. 24
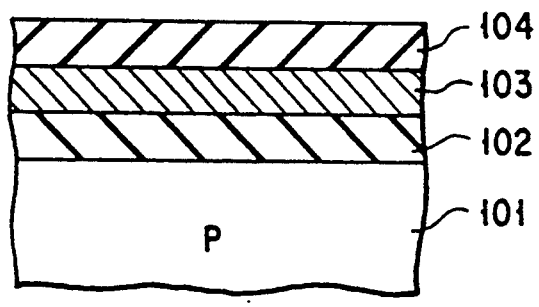
F I G. 25A
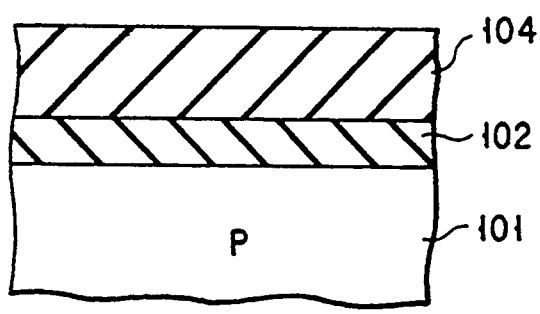
F I G. 25B

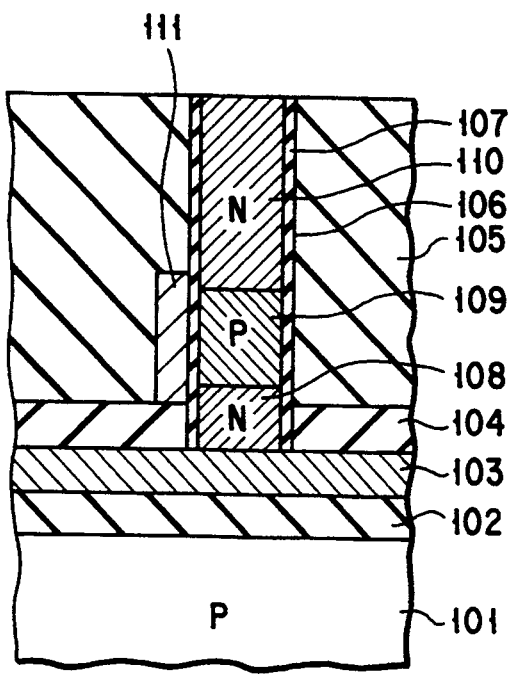 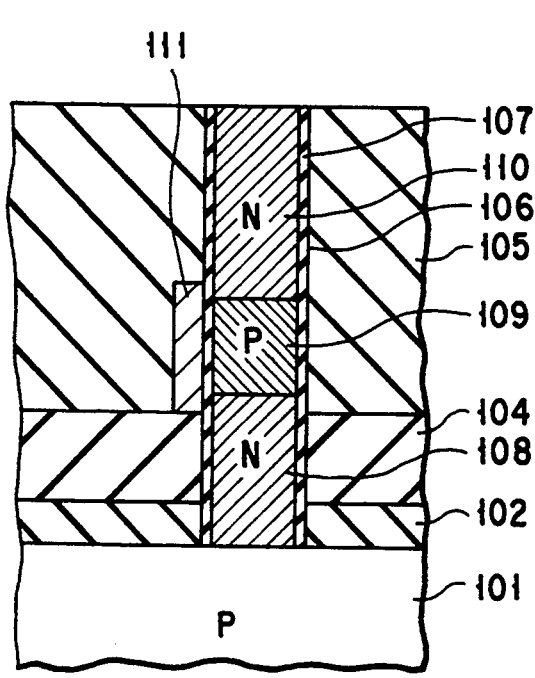
FIG. 28A  FIG. 28B
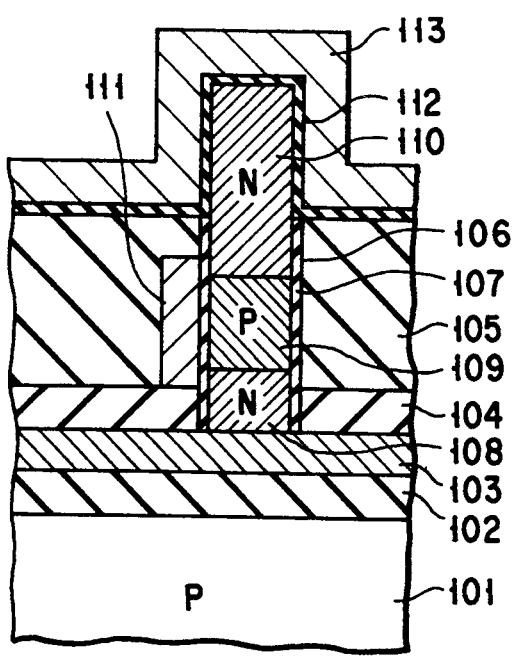 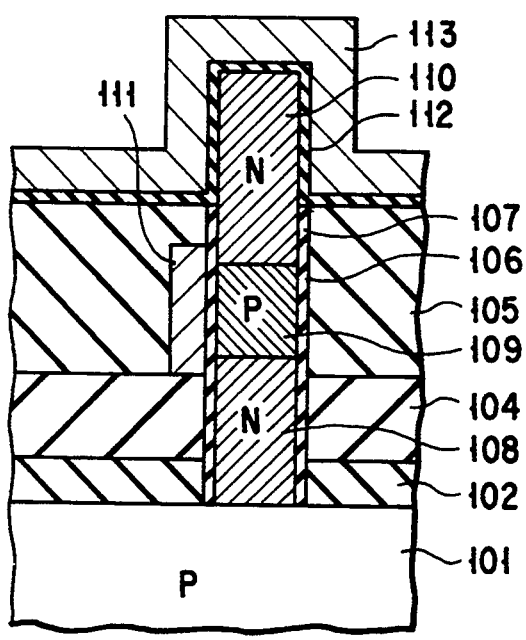
FIG. 29A  FIG. 29B

DYNAMIC MEMORY CELL USING HOLLOW POST SHAPE CHANNEL THIN-FILM TRANSISTOR

BACKGROUND OF THE INVENTION

1. Field of the Invention

The present invention relates to thin-film transistors, semiconductor devices having dynamic memory cells using hollow post shape channel thin-film transistors and methods of manufacture thereof.

2. Description of the Related Art

The packing density of memory cells in dynamic random access memories (DRAMs) has been increased by a factor of four every three years. Nowadays 256 M-bit and 1 G-bit memory cell structures are proposed. An example is found in an article entitled "A Surrounding Gate Transistor (SGT) Cell for 64/256Mbit DRAM", International Electron Devices Meeting (IEDM) 1989 Technical Digest, pp 23-26. The memory cell described in the article is what is referred to as a crosspoint type cell, in which a vertical transfer gate is formed by forming a capacitor in the lower portion of a silicon post and forming a word line to surround the upper portion of the silicon post, and a bit line is formed on the uppermost portion of the silicon post so that it is orthogonal to the word line.

However, the memory cell with the structure as described above suffers from problems that, since there is a need of etching a silicon substrate to form a silicon post, its manufacturing process is complex and moreover a great number of steps are required, making its manufacturing cost high and its manufacturing yield low.

SUMMARY OF THE INVENTION

It is accordingly an object of the present invention to provide a semiconductor device and a method of manufacture thereof which permit high-density integration and manufacture thereof at low cost and high yield.

According to a first aspect of the present invention there is provided a semiconductor device comprising: a first insulating layer; a gate electrode layer formed on the first insulating layer; a second insulating layer formed on the gate electrode layer; an opening formed through the first insulating layer, the gate electrode layer and the second insulating layer; a gate insulating layer formed within the opening to overlay at least the gate electrode layer; a first semiconductor layer formed on the gate insulating layer to oppose the gate electrode layer within the opening; a second semiconductor layer formed within the opening so at to make contact with the first semiconductor layer and oppose the first insulating layer; and a third semiconductor layer formed within the opening so as to make contact with the first semiconductor layer and oppose the second insulating layer.

According to a second aspect of the present invention, there is provided a method of manufacturing a semiconductor device comprising the steps of: forming a first insulating layer on a semiconductor substrate; forming a conductive layer on the first insulating layer; patterning the conductive layer, thereby forming a wiring; forming a second insulating layer on the entire surface of a resultant structure; forming an opening in the first insulating layer, the wiring and the second insulating layer; coating at least said wiring exposed in said opening with a third insulating layer; and forming a semiconductor layer at least on the third insulating layer within the opening.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view of a memory cell according to a first embodiment of the present invention;

FIG. 2 is a plan view of a small area of a semiconductor device into which several memory cells of FIG. 1 are integrated;

FIG. 5 is a sectional view illustrating steps subsequent to the steps of FIG. 4;

FIG. 7 is a sectional view illustrating steps subsequent to the steps of FIG. 6;

FIG. 8 is a sectional view illustrating steps subsequent to the steps of FIG. 7;

FIG. 9 is a plan view of a small area of a semiconductor device into which several memory cells according to a second embodiment of the present invention are integrated;

FIG. 10 is a sectional view illustrating initial steps of manufacture of the memory cell of FIG. 9;

FIG. 11 is a sectional view illustrating steps subsequent to the steps of FIG. 10;

FIG. 12 is a sectional view illustrating steps subsequent to the steps of FIG. 11;

FIG. 13 is a sectional view illustrating steps subsequent to the steps of FIG. 12;

FIG. 14 is a sectional view illustrating steps subsequent to the steps of FIG. 13;

FIG. 17 is a sectional view illustrating steps subsequent to the steps of FIG. 16;

FIG. 18 is a sectional view illustrating steps subsequent to the steps of FIG. 17;

FIG. 19 is a sectional view illustrating steps subsequent to the steps of FIG. 18;

FIG. 23 is a sectional view of a memory cell according to a sixth embodiment of the present invention;

FIG. 24 is a plan view of a small area of a semiconductor chip into which several memory cells of FIG. 23 are integrated;

FIG. 25A is a sectional view illustrating initial steps of manufacture of the memory cell of FIG. 23;

FIG. 25B is a sectional view illustrating initial steps of manufacture of the memory cell of FIG. 23;

FIG. 28A is a sectional view illustrating steps subsequent to the steps of FIG. 27A;

FIG. 28B is a sectional view illustrating steps subsequent to the steps of FIG. 27B;

FIG. 29A is a sectional view illustrating steps subsequent to the steps of FIG. 28A; and FIG. 29B is a sectional view illustrating steps subsequent to the steps of FIG. 28B.

DETAILED DESCRIPTION OF THE PREFERRED EMBODIMENTS

Figure 3:
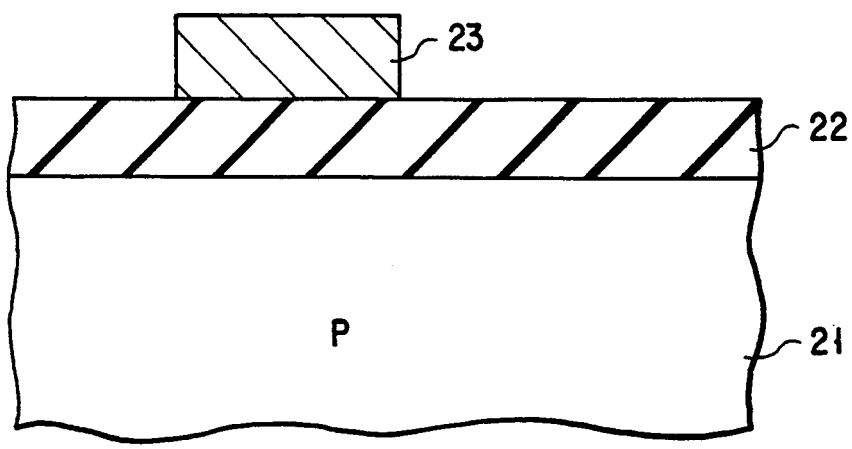
FIG. 3 is a sectional view illustrating initial steps of manufacture of the memory cell of FIG. 1.

Referring now to FIGS. 1 and 2, there is shown a first embodiment in which a semiconductor device of the present invention is applied to a DRAM. More specifically, FIG. 1 is a sectional view of a 1-bit memory cell composed of a data storage capacitor and a transfer gate (MOS transistor), and FIG. 2 is a plan view of a small area on a semiconductor chip into which memory cells are integrated. FIG. 1 is a sectional view taken along line A - A' of FIG. 2.

In FIG. 2, 11 denotes bit lines (BL), 12 denotes word lines (WL), and 13 denotes openings in which transfer gates are formed. A single memory cell 14 occupies an area enclosed by broken lines. That is, in this DRAM, a plurality of memory cells 14 are formed, and each memory cell is placed at a respective one of intersections of the bit lines BL and the word lines WL. As a result, the memory cells are arranged in a matrix form.

Each of the memory cells has such a sectional structure as shown in FIG. 1.

In FIG. 1, 21 denotes a semiconductor silicon substrate of P-type conductivity, on which an insulating layer 22 of silicon dioxide ($SiO_2$) or the like is formed. A bit line 23 of tungsten silicide ($WSi_2$) is formed on a portion of the insulating layer 22. An insulating layer 24, which is made of BPSG (boron-phosphorous silicate glass), PSG (phosphorous silicate glass) or AsSG (arsenic silicate glass) and contains N-type impurities, is deposited over the insulating layer 22 and the bit line 23. A gate electrode layer 25 of polycrystalline silicon containing N-type impurities is deposited on the insulating layer 24. The gate electrode 25 is also used as a word line. An insulating layer 26 containing N-type impurities is deposited on the gate electrode 25. An opening 27 is formed through the insulating layer 26, the gate electrode layer 25 and the insulating layer 24. The opening 27 is formed such that its portion comes to an end at the bit line 23 and its remaining portions reach the substrate 21. In that surface region of the substrate 21 which is located under the opening 27 is formed an N-type region 28.

A gate insulating layer 29 is deposited on the inner surface of the opening 23 except its bottom portion and upper surface of the bit line 23. On the gate insulating layer 29 is deposited a monocrystalline silicon layer 30 which is so thin as not to bury the opening 27. The monocrystalline silicon layer 30 is formed to protrude from the insulating layer 26, i.e., the opening 27. The monocrystalline silicon layer 30 is divided into three regions 30a, 30b and 30c. The monocrystalline silicon layer 30a that is opposed to the gate electrode 25 with the gate insulating layer 29 interposed therebetween contains P-type impurities and serves as the channel region of a transfer gate. The monocrystalline silicon layer 30b that is in contact with the layer 30a and opposed to the insulating layer 22 with the gate insulating layer 29 interposed therebetween contains N-type impurities and serves as the drain or source region of the transfer gate. The monocrystalline silicon layer 30c that is in contact with the layer 30a and opposed to the insulating layer 26 with the gate insulating layer 29 interposed therebetween contains N-type impurities and serves as the source or drain region of the transfer gate.

An insulating layer 31 of silicon dioxide, boron silicate glass or the like, containing P-type impurities, is deposited on the monocrystalline silicon layer 30 in the opening 27 to thereby bury the opening.

A dielectric layer 32 of, for example, $Ta_2O_5$, which is adapted to form a capacitor, is deposited on the insulating layer 26 and the protruded portions of the monocrystalline silicon layer 30c. A plate electrode 33 of the capacitor, made of, for example, tungsten (W), is deposited on the capacitor dielectric layer 32.

As can be seen, the memory cell of FIG. 1 takes the form of a post and is provided with the monocrystalline silicon layer 30a serving as the channel region, the gate electrode 25 formed to surround the post-like channel region 30a with the gate insulating layer 29 interposed therebetween, and the monocrystalline silicon layers 30b and 30C which are in contact with both ends of the post-like channel region 30a and serve as the source and drain regions of a transfer gate. With such a memory cell, the source, the drain and the channel region of the transfer gate are formed within an opening. Though described as containing P-type impurities, the monocrystalline silicon layer 30a needs not necessarily to contain impurities, that is, it may be intrinsic.

As has been indicated, the memory cell has the channel region of its transfer gate surrounded with the gate electrode. Hence, the electric field applied on the channel region can be controlled more reading than in a memory cell in which the gate electrode is formed inside the channel region.

Hereinafter, a method of manufacturing the memory cell shown in FIG. 1 will be described.

As shown in FIG. 3, the insulating layer 22 of silicon dioxide is first deposited over the P-type silicon semiconductor substrate 21. $WSi_2$ is next deposited over the entire surface by means of chemical vapor deposition (CVD), and is then patterned by using a mask which defines the bit lines shown in FIG. 2 to form the bit lines 23.

Figure 4:
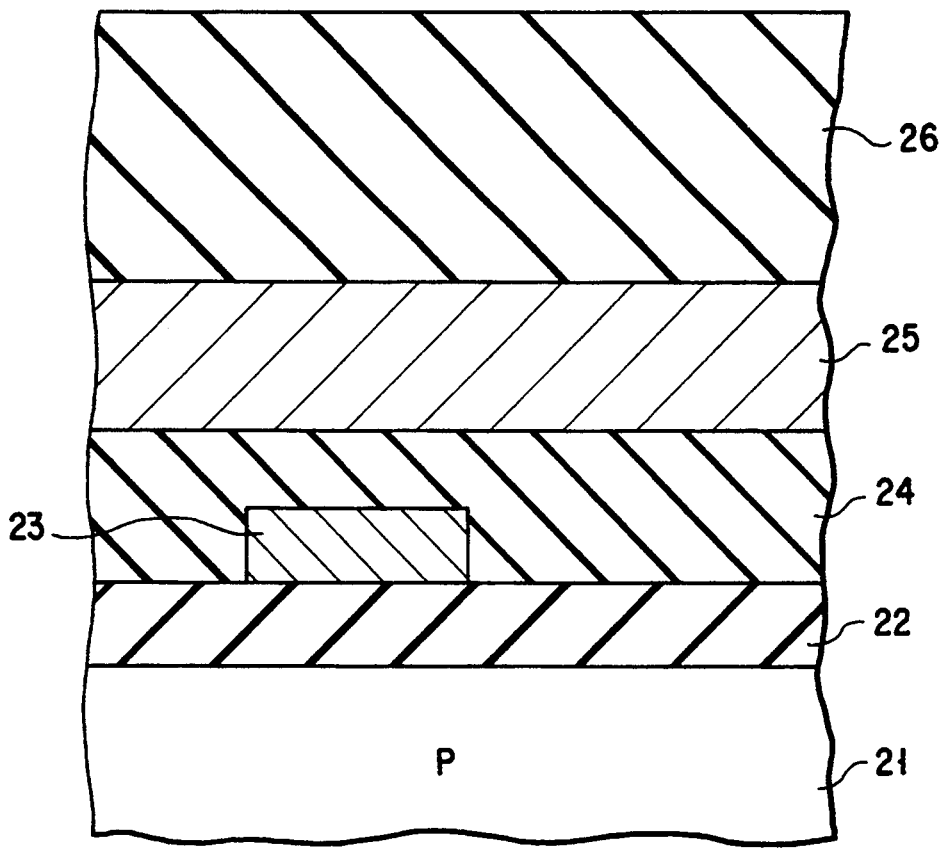
FIG. 4 is a sectional view illustrating steps subsequent to the steps of FIG. 3.

As shown in FIG. 4, the insulating layer 24 of BPSG, PSG or AsSG containing N-type impurities is next deposited over the insulating layer 22 and the bit line 23 and is then flattened by means of polishing. Polycrystalline silicon which is doped N type is next deposited over the insulating layer 24 and is then patterned by using a mask which defines the word lines shown in FIG. 2 to form the gate electrodes 25. The N-type insulating layer 26 is next deposited over the entire surface and is then flattened in the same manner as described above.

As shown in FIG. 5, an opening is next formed through the insulating layer 22, the insulating layer 24, the gate electrode 25 and the insulating layer 26 so as to expose a portion of the bit line 23 and a portion of the surface of the semiconductor substrate 21. Subsequently, the gate insulating layer 29 of silicon dioxide is deposited over the entire surface and then etched back by means of reactive ion etching (RIE) to leave the gate insulating layer 29 on the wall of the opening 27. It is to be noted that the gate insulating layer 29 located on the bit line 23 is also etched away by the reactive ion etching.

Figure 6:
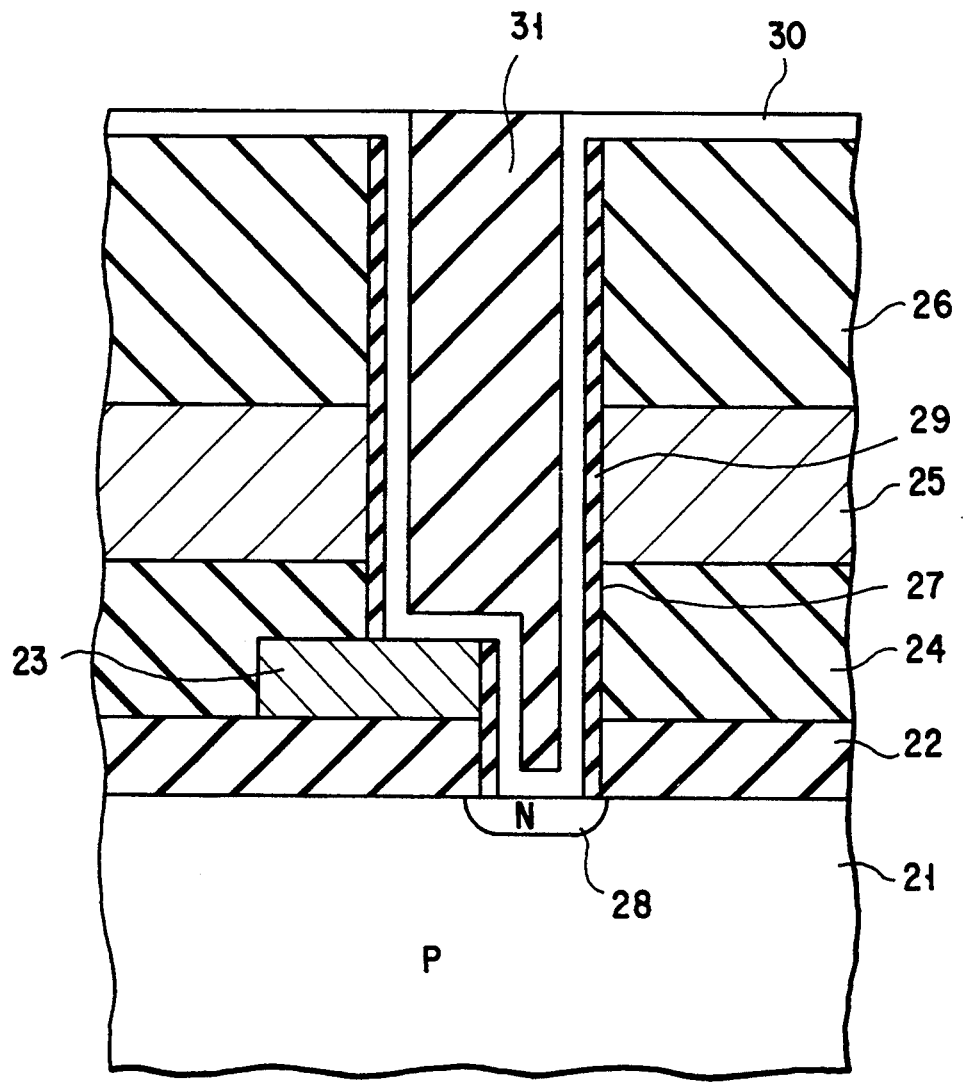
FIG. 6 is a sectional view illustrating steps subsequent to the steps of FIG. 5.

Next, as shown in FIG. 6, an amorphous silicon layer is deposited over the entire surface, and N-type impurities, such as arsenic, are implanted vertically into the amorphous silicon layer to form the N-type region 28 in a surface region of the substrate 21. Subsequently, a heat treatment operation is performed in order to transform the amorphous silicon layer into the monocrystalline silicon layer 30 with the semiconductor substrate 21 used as the seed of this transformation. Subsequently, the insulating layer 31 of silicon dioxide or BSG is deposited over the entire surface including the inside of the opening 27 and then etched back to leave the insulating layer 31 only in the opening 27. At this point, the amorphous silicon which has been transformed into monocrystalline silicon serves as a stopper for the etch back.

Next, as shown in FIG. 7, the remains of the monocrystalline silicon layer 30 on the insulating layer 26 are etched away. Subsequently, heat treatment is carried out so as to diffuse the N-type impurities, such as phosphor or arsenic, contained in the insulating layers 24 and 26 into those portions of the monocrystalline silicon layer 30 which are opposed to the insulating layers 24 and 26, thereby forming the N-type doped monocrystalline silicon layers 30b and 30c. The monocrystalline silicon layers 30b and 30c containing N-type impurities serve as the source and drain regions of the transfer gate of a memory cell, and the monocrystalline silicon layer 30a between the layers 30b and 30c serves as the channel region of the transfer gate. When BSG is used for the insulating layer 31, boron contained in the BSG is diffused into the channel region. The doping of the channel region permits the threshold voltage Vth of the transfer gate to be controlled. For this reason, the boron content of the BSG layer is set beforehand so that a desired threshold voltage Vth can be obtained. If silicon dioxide is used for the insulating layer 31, then the monocrystalline silicon layer 30a serving as the channel region will be intrinsic.

As shown in FIG. 8, a portion of each of the insulating layer 26, the gate insulating layer 29 and the insulating layer 31 is next etched away so as to protrude a portion of the monocrystalline silicon layer 30c. Subsequently, the capacitor dielectric layer 32 of tantalum oxide ($Ta_2O_5$) is deposited over the entire surface to coat the monocrystalline silicon layer 30c. Further, the capacitor plate electrode 33 of tungsten is deposited over the entire surface, whereby such a memory cell structure as shown in FIG. 1 is obtained.

With the above-described manufacturing method, four masks are used to pattern the bit lines 23, the word lines (gate electrodes 25), the openings 27 and the capacitor plate electrodes 33 each overlying the entire surface of a memory cell. A small number of masks required permit a considerable reduction of the number of manufacturing steps, which allows DRAMs to be manufactured at low cost and high yield.

FIG. 9 is a plan view of a second embodiment of a DRAM to which the semiconductor device of the present invention is applied. In FIG. 9, corresponding parts to those in FIG. 2 are denoted by like reference characters.

Reference numeral 11 denotes bit lines, 12 denotes word lines, 13 denotes openings in which transfer gates are formed, 14 denotes a 1-bit memory cell, and 15 denotes trenches in which data storage capacitors are formed.

Hereinafter, reference will be made to FIGS. 10 through 14 to describe a method of manufacturing the DRAM cell shown in FIG. 9. Note that FIGS. 10 through 14 are sectional views, in the order of stages of manufacture, taken along line A - A' of FIG. 9.

As shown in FIG. 10, a silicon dioxide ($SiO_2$) layer 52 is first deposited over a P-type silicon substrate 51, and a silicon nitride ($Si_3N_4$) layer 53 is then deposited over the layer 52. The layers are both etched to form a mask serving to form trench in the substrate. Next, using the mask the substrate 51 is etched to form a trench 54. A silicon dioxide layer 55 is next deposited onto the surface of the trench 54, and only a portion of the silicon dioxide layer 55 that overlies the bottom of the trench 54 is then etched away. An N-type doped polycrystalline silicon layer 56 is next deposited, and N-type impurities, such as phosphorous, are then ion implanted to form an N-type region 57 in a bottom region of the trench 54. Subsequently, the polycrystalline silicon layer 56 is patterned so that it is left only within the trench 54. The polycrystalline silicon layer 56 is next coated with a capacitor dielectric layer 58 consisting of stacked layers of silicon dioxide and silicon nitride, and an N-type doped polycrystalline silicon layer 59 is subsequently embedded in the trench 54 to form a capacitor storage electrode. Subsequently, using the silicon nitride layer 53 as a mask, the surface is subjected to an oxidation operation to form a silicon dioxide layer 60.

The formation of such a capacitor as includes an N-type region (57) formed within a P-type substrate (51) as its plate electrode and a polycrystalline silicon layer (59) formed within a trench (54) as its storage electrode is described, for example, in "International Electron Device Meeting (IEDM), 1987 Technical Digest", page 332. A capacitor may be formed in the same manner as that described in the literature.

As shown in FIG. 11, an N-type doped insulating layer 61 of BPSG, PSG, AsSG or the like is next deposited over the entire surface, and its surface is then flattened by means of polishing techniques. N-type doped polycrystalline silicon is next deposited and then patterned, using a mask which defines the word lines shown in FIG. 9, to form a gate electrode 62. An insulating layer 63 containing N-type impurities is next deposited over the entire surface and then flattened by means of the same method as described above.

As shown in FIG. 12, an opening 64 is next formed in the insulating layer 63, the gate electrode 62, the insulating layer 61, the silicon nitride layer 53, and the silicon dioxide layer 52 so that portions of the trench 54 and the substrate 51 are exposed. A gate insulating layer 65 of silicon dioxide is next deposited over the entire surface and is then subjected to reactive ion etching, so that it is left on the inner surface of the opening 64.

As shown in FIG. 13, an amorphous silicon layer is next deposited over the entire surface, and N-type impurities, such as arsenic, are then ion implanted vertically into the amorphous silicon layer to form an N-type region 66 in a surface region of the silicon substrate 51. Subsequently heat treatment is carried out to transform the amorphous silicon layer into monocrystalline silicon layer 67 with the silicon substrate 51 used as the seed of this transformation. An insulating layer 68 of silicon dioxide or BSG is next deposited over the entire surface including the opening 64 and then selectively etched away so that it is left only within the opening 67. At this point, the amorphous silicon that has been transformed into the monocrystalline silicon is used as an etch stopper in etching the insulating layer 68.

A heat treatment operation is next carried out to diffuse N-type impurities, such as phosphorous or arsenic, contained in the insulating layers 61 and 63 into those portions of the monocrystalline silicon layer 67 which are opposed to the insulating layers 61 and 63, thereby forming N-type doped monocrystalline silicon layers 67b and 67c as shown in FIG. 14. These N-type doped monocrystalline silicon layers 67b and 67c serve as source and drain regions of the transfer gate of a memory cell. The monocrystalline silicon layer 67a between the layers 67b and 67c serves as the channel region of the transfer gate.

If the insulating layer 68 is made of BSG, then boron impurities contained in the BSG layer will be diffused into the channel region as well. The doping of the channel region permits the threshold voltage Vth of the transfer gate to be controlled. Also, if a mere silicon dioxide layer that contains no impurities is used as the insulating layer 68, then the monocrystalline silicon layer 67a will be intrinsic. A layer of, for example, WSi$_2$ is next deposited, and the WSi$_2$ layer and the monocrystalline silicon layer 67c are then etched away using a mask which defines the pattern of the bit lines shown in FIG. 9. Thereby, a bit line 69 is formed to complete the memory cell structure.

By means of the method described above, a memory cell is fabricated which has a capacitor in the trench 54 formed within the substrate 51 and a transfer gate in the opening 64 formed through the insulating layer 61, the gate electrode 62 and the insulating layer 63 which are located over the substrate.

With the manufacturing method described above, four masks are used to pattern the trenches 54, the openings 64, the bit lines 69 and the word lines (gate electrodes 62). A small number of masks required permit a considerable reduction of the number of manufacturing steps, which allows DRAMs to be manufactured at low cost and high yield.

Although the first and second embodiments of the present invention described above are directed to DRAMs, the invention may be directed to MOS transistors. Hereinafter, embodiments in which the present invention is directed to MOS transistors will be described.

Figure 15:
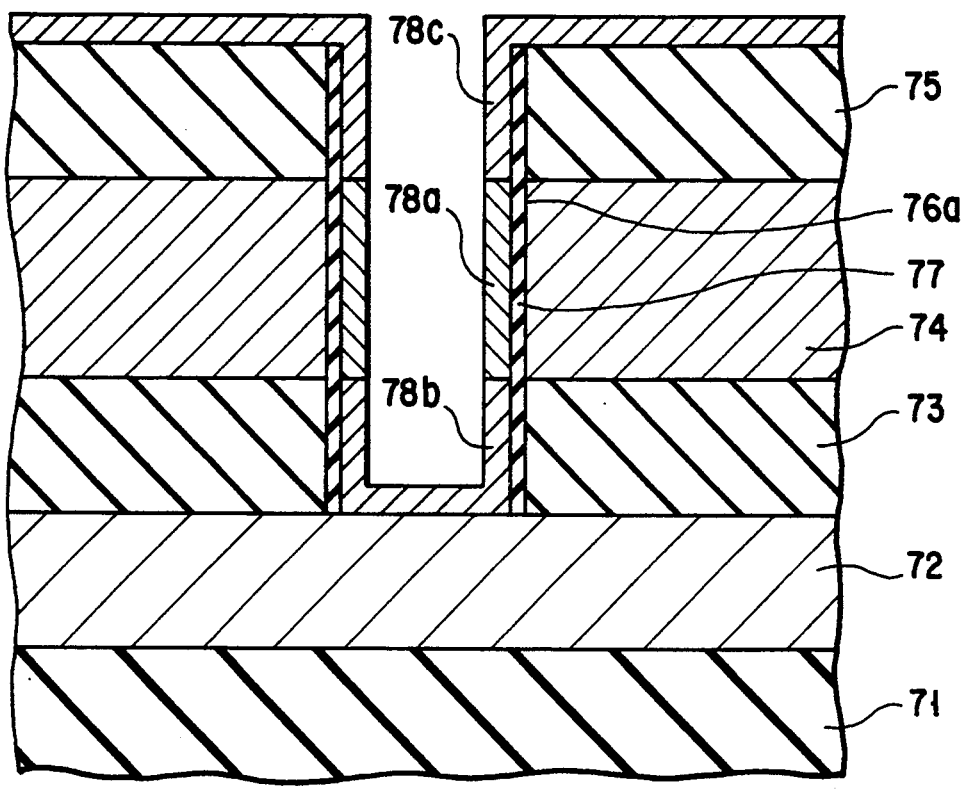
FIG. 15 is a sectional view of a MOS transistor according to a third embodiment of the present invention.

FIG. 15 is a sectional view of a MOS transistor according to a third embodiment of the present invention.

In FIG. 15, 71 denotes an insulating substrate on which a WSi$_2$ layer 72 is formed in a desired pattern. An N-type doped insulating layer 73 of BPSG, PSG, AsSG or the like is deposited onto the WSi$_2$ layer 72. On the insulating layer 73 an N-type doped gate electrode 74 of polycrystalline silicon is formed in a desired pattern.

Further, an N-type doped insulating layer 75 is formed on the gate electrode 74.

An opening 76a is formed in the insulating layer 75, the gate electrode 74 and the insulating layer 73 to reach the WSi$_2$ layer 72. A gate insulating layer 77 is formed on the inner wall of the opening 76a except its bottom. Further, on the surface of the gate insulating layer 77 is formed a semiconductor layer which is so thin as not to bury the opening 76. The semiconductor layer is divided into three regions 78a, 78b and 78c. The semiconductor layer 78a, which is located to oppose the gate electrode layer 74 with the gate insulating layer 77 interposed therebetween, contains P-type impurities and serves as the channel region of a MOS transistor. The semiconductor layer 78b, which is in contact with the semiconductor layer 78a and located to oppose the insulating layer 73 with the gate insulating layer 77 interposed therebetween, contains N-type impurities and serves as the drain or source region of the MOS transistor. The semiconductor layer 78c, which is in contact with the semiconductor layer 78a and located to oppose the insulating layer 75 with the gate insulating layer 77 interposed therebetween, contains N-type impurities and serves as the source or drain region of the MOS transistor.

The MOS transistor with the above structure has the shape of a hollow post and is provided with the semiconductor layer 78a serving as the channel region, the gate electrode 74 that surrounds the channel region with the gate insulating layer 77 interposed therebetween, and the semiconductor layers 78b and 78c which are in contact with the channel region at its both ends and serve as the source and drain regions. In such a transistor, the source, drain and channel regions are formed within one opening.

Hereinafter, a description will be made of a method of manufacturing a MOS transistor having the structure shown in FIG. 15, including steps of forming metal connections.

Figure 16:
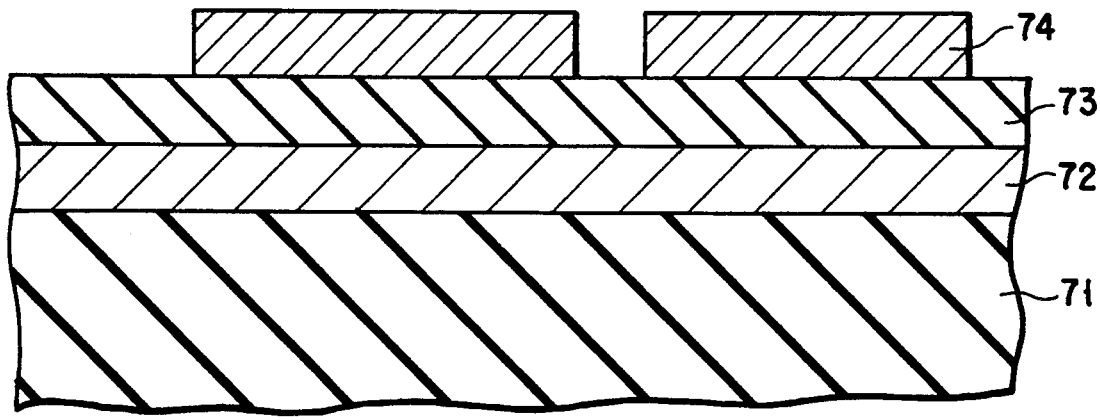
FIG. 16 is a sectional view illustrating initial steps of manufacture of the memory cell of FIG. 15.

As shown in FIG. 16, the WSi$_2$ layer 72 is first deposited over the substrate 71 by means of CVD and then patterned using conventional photolithographic masking and reactive ion etching techniques. The N-type doped insulating layer 73 of BPSG, PSG or AsSG is next deposited over the entire surface and then flattened by means of polishing technique. N-type doped polycrystalline silicon is next deposited and then patterned in the same manner to define the gate electrode 74.

As shown in FIG. 17, the N-type doped insulating layer 75 is next deposited over the entire surface and then flattened by means of polishing techniques. Subsequently, opening 76a is formed in the insulating layer 75, the gate electrode layer 74 and the insulating layer 73 to reach the WSi$_2$ layer 72, and opening 76b is formed in the insulating layer 75 to reach the gate electrode 74.

As shown in FIG. 18, the gate insulating layer 77 of silicon dioxide is next deposited over the entire surface and then etched by means of reactive ion etching techniques, so that the gate insulating layer is left on the walls of the openings 76a and 76b. An amorphous silicon layer 79 is subsequently deposited over the entire surface.

AS shown in FIG. 19, an insulating layer 80 of silicon dioxide or BSG is next deposited over the entire surface and then etched to leave the insulating layer 80 only within the openings 76a and 76b. At this point, the amorphous silicon layer 79 is used as an etching stopper.

The amorphous silicon layer 79 is next patterned and is then subjected to heat treatment, thereby diffusing the N-type impurities, such as phosphorous or arsenic, contained in the insulating layers 73 and 75 into the amorphous silicon layer 79. As a result, N-type doped semiconductor layers 79b and 79c are formed in those regions of the amorphous silicon layer 79 which are opposed to the insulating layers 73 and 75. The semiconductor layers 79b and 79c serve as the source and drain regions of a MOS transistor, and the semiconductor layer 79a between the semiconductor layers 79b and 79c serves as the channel region. Where BSG is used for the insulating layer 80, boron impurities contained in the BSG layer are diffused into the channel region. The doping of the channel region permits the threshold voltage Vth of the MOS transistor to be controlled. For this reason, the content of boron in the BSG layer is set beforehand so that a desired threshold voltage Vth can be obtained. If silicon dioxide having no impurities is used for the insulating layer 80, then the semiconductor layer 79a will be intrinsic.

Figure 20:
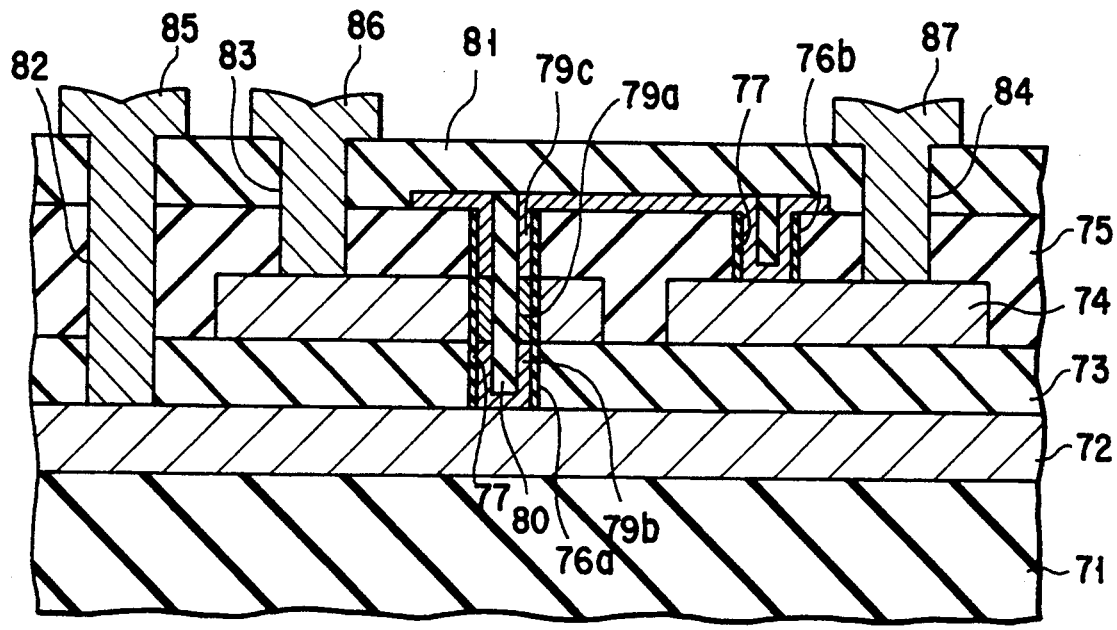
FIG. 20 is a sectional view illustrating steps subsequent to the steps of FIG. 19.

As shown in FIG. 20, an insulating layer of silicon dioxide is next deposited over the entire surface, and openings 82, 83 and 84 are then formed. Subsequently, metal leads 85, 86 and 87 made of metal, such as aluminum, are formed to complete the MOS transistor.

The MOS transistor having the structure and the manufacturing steps described above permits a reduction of the area occupied by a single device because of the formation of the source, drain and channel regions within one opening. In addition, the source, drain and channel regions are formed in a self-aligned manner, which eliminates the need of keeping a long distance for device isolation, permitting high packing density.

Figure 21:
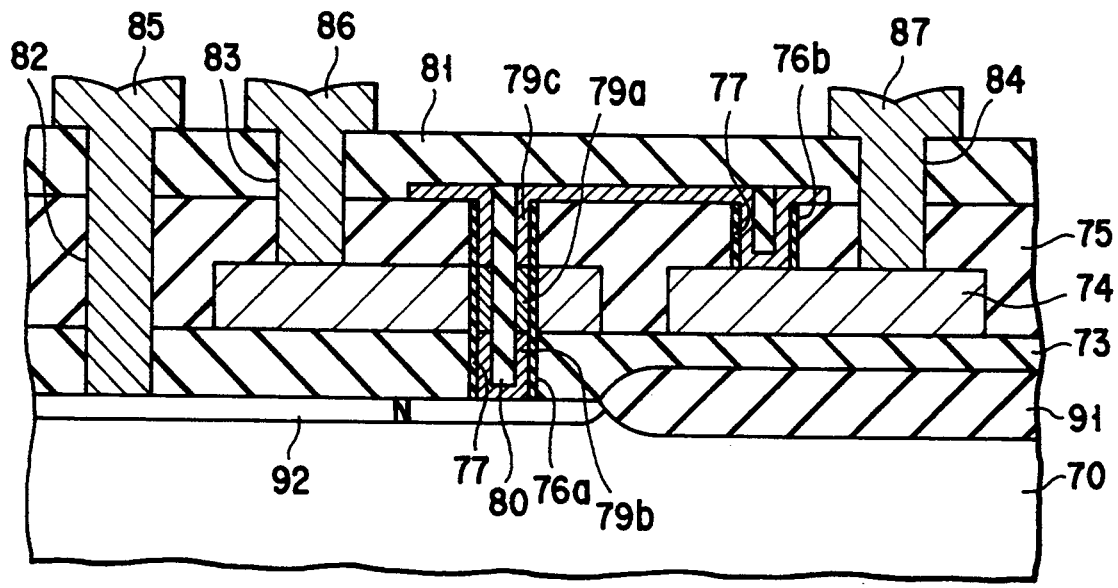
FIG. 21 is a sectional view of a MOS transistor according to a fourth embodiment of the present invention.

FIG. 21 is a sectional view of a MOS transistor according to a fourth embodiment of the present invention. This MOS transistor is distinct from the MOS transistor shown in FIG. 20 in that a field oxide layer 91 and an N-type diffused region 92 are formed in a surface of a P-type silicon semiconductor substrate 70, and the WSi$_2$ layer 72 is not formed on the substrate.

The MOS transistor is fabricated as follows. First, the field oxide layer 91 is selectively formed on the silicon semiconductor substrate 70 of P-type conductivity, and N-type impurities, such as arsenic, are ion implanted to form the N-type region 92. The subsequent manufacturing steps are the same as those used in the third embodiment. After the formation of the amorphous silicon layer 79, a heat treatment operation is carried out, so that the amorphous silicon layer is recrystallized with the semiconductor substrate 70 used as the seed of this recrystallization. This permits a high-performance MOS transistor which is good in crystallinity to be provided.

Figure 22:
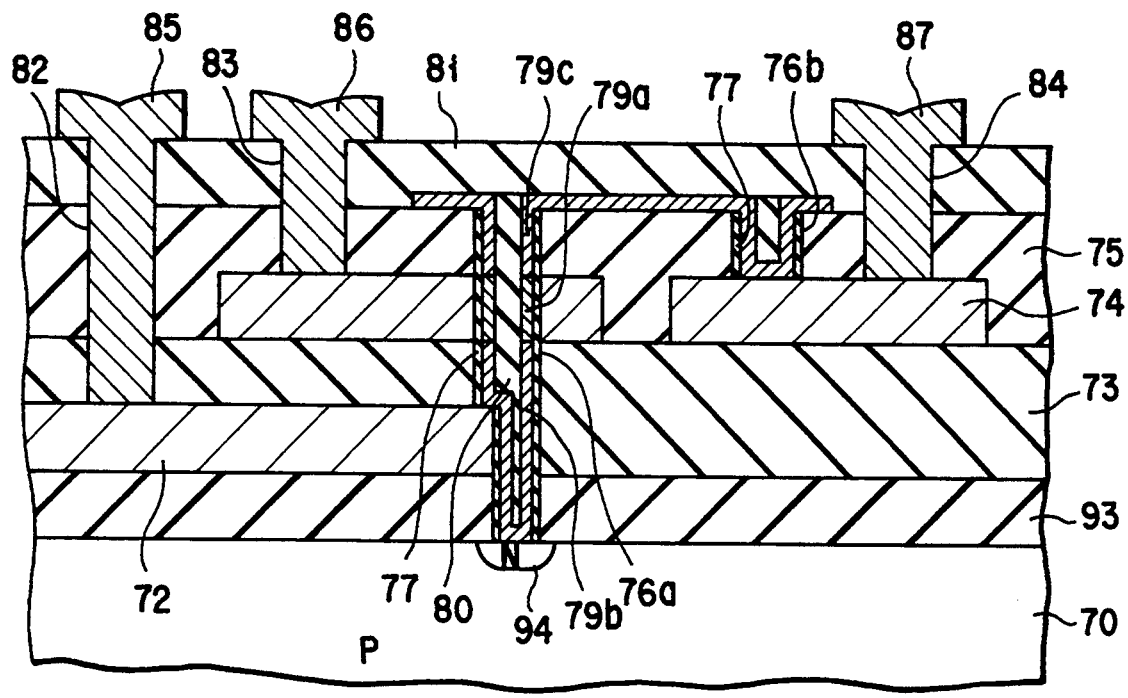
FIG. 22 is a sectional view of a MOS transistor according to a fifth embodiment of the present invention.

FIG. 22 is a sectional view of a MOS transistor according to a fifth embodiment of the present invention. This MOS transistor is distinct from the MOS transistor shown in FIG. 20 in that a WSi$_2$ layer 72 is formed over the silicon substrate 70 with an insulating layer 93 interposed therebetween, an N-type region 94 is formed in a surface region of the substrate 71.

In a method of manufacturing the MOS transistor, the steps subsequent to the formation of the insulating layer 93 on the silicon semiconductor substrate 70 and the selective formation of the WSi$_2$ layer 72 on the insulating layer 93 are substantially the same as those in the method for the third embodiment. In forming openings, the opening 76a is formed slightly shifted from the WSi$_2$ layer 72 to reach the substrate 70. By doing so, the semiconductor layers 79a, 79b and 79c are recrystallized by using the semiconductor substrate 70 as the seed of recrystallization as described in connection with the fourth embodiment shown in FIG. 21. The WSi$_2$ layer 72 can be used to draw out the metal lead 85.

FIGS. 23 and 24 illustrate a sixth embodiment in which the present invention is applied to a DRAM. More specifically, FIG. 23 is a sectional view of a 1-bit memory cell composed of a data storage capacitor and a transfer gate (MOS transistor), and FIG. 24 is a plan view of an area of a semiconductor chip into which several memory cells are integrated. FIG. 23 is a sectional view taken along line A - A' of FIG. 24.

In FIG. 24, 11 denotes bit lines (BL), 12 denotes word lines (WL), and 13 denotes openings in each of which a transfer gate is formed. A single memory cell is formed within an area enclosed by broken lines 14. That is, in the case of this DRAM as well, each memory cell is placed at a respective one of intersections of the bit lines 11 and the word lines 14, and thus a number of memory cells are arranged in the form of a matrix.

The structure of the memory cell shown in FIG. 23 will be described next.

Reference numeral 101 denotes a silicon semiconductor substrate of P-type conductivity. An insulating layer 102 of silicon dioxide is formed on the substrate 101. A WSi$_2$ layer is deposited on the insulating layer 102 and then patterned to form a bit line 103. An insulating layer 104 is formed on the bit line 103 and the insulating layer 102, and an insulating layer 105 is formed on the insulating layer 104, the insulating layers 104 and 105 being of silicon dioxide. An opening 106 is formed in the insulating layers 104 and 105. Though not shown in FIG. 23, the opening 106 is formed so that its portion comes to an end at the bit line 103, while its remaining portion reaches the substrate 101.

A gate insulating layer 107 of a three-layer structure comprising an oxide layer, a nitride layer and an oxide layer (i.e., ONO structure) is formed on the inner surface of the opening 106 except its bottom. A monocrystalline silicon region 108 containing N-type impurities is formed in the opening, which serves as the source region or the drain region of a transfer gate. A monocrystalline silicon region 109 containing P-type impurities is formed on the region 108, which serves as the channel region of the transfer gate. Further, a monocrystalline silicon region 110 containing N-type impurities is formed on the channel region 109, which serves as the drain region or the source region of the transfer gate. A transfer gate electrode 111 of N-type doped polycrystalline silicon is formed adjacent to the channel region 109 with the insulating layer 107 interposed therebetween.

The region 110 is formed so that its top protrudes from the insulating layer 105 as shown. A capacitor dielectric layer 112 is deposited over the exposed surface of the region 110 and the exposed surface of the insulating layer 105. A plate electrode 113 of the data storage capacitor is formed on the insulating layer 112. The N-type monocrystalline silicon region, serving as the region 110, is also used as the capacitor storage electrode.

In the memory cell with the above structure, the source, drain and channel regions of the transfer gate are formed in the opening 106 formed in the insulating layers overlying the substrate 101, and the data storage capacitor is formed in the top portion of the transfer gate.

Hereinafter, a method of manufacturing the memory cell shown in FIG. 23 will be described with reference to FIGS. 25A through 29A and FIGS. 25B through 29B. More specifically, FIGS. 25A through 29A are sectional views, in the order of stages of manufacture, taken along line B - B' of FIG. 24, and FIGS. 25B through 29B are sectional views, in the order of stages of manufacture, taken along line C - C' of FIG. 24.

As shown in FIGS. 25A and 25B, the insulating layer 102 of silicon dioxide having a thickness of about 100 nm is first formed over the entire surface of the P-type silicon substrate 101 by subjecting the substrate to, for example, oxidation. A WSi$_2$ layer is formed, at a thickness of about 100 nm, over the entire surface by means of CVD and then patterned, as shown in FIG. 24, to form the bit lines 103. The insulating layer 104 of silicon dioxide is next deposited over the entire surface and then flattened.

Figure 26A:
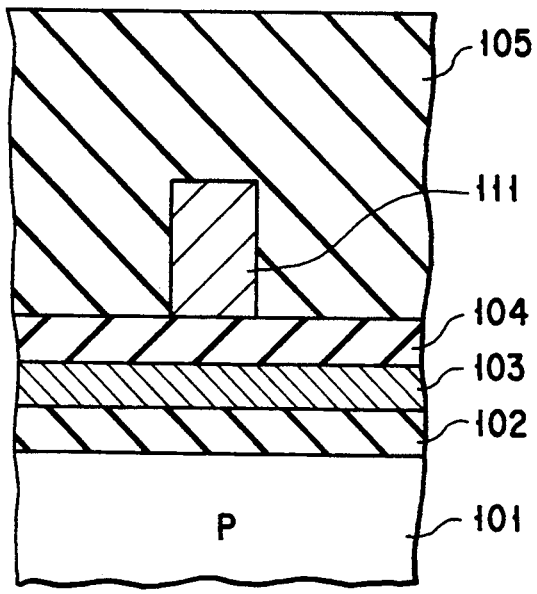
FIG. 26A is a sectional view illustrating steps subsequent to the steps of FIG. 25A.
Figure 26B:
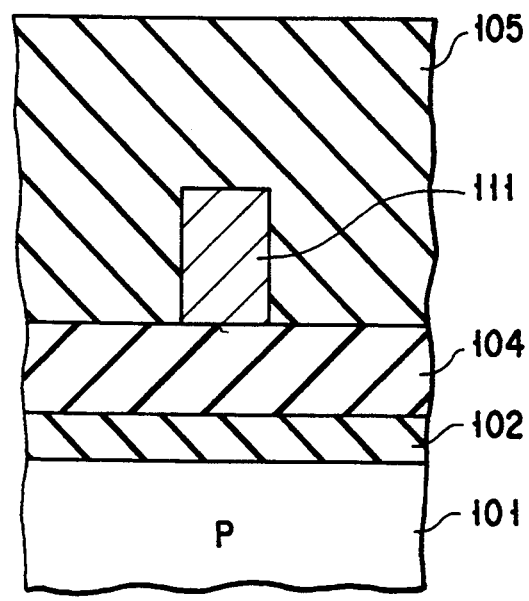
FIG. 26B is a sectional view illustrating steps subsequent to the steps of FIG. 25B.

AS shown in FIGS. 26A and 26B, N-type doped polycrystalline silicon is next deposited at a thickness of 300 to 500 run and then patterned, as shown in FIG. 24, to form the gate electrodes 111. A layer of silicon dioxide is deposited, at a thickness of about 1 $\mu$m, over the entire surface to form the insulating layer 105 and then flattened.

Figure 27A:
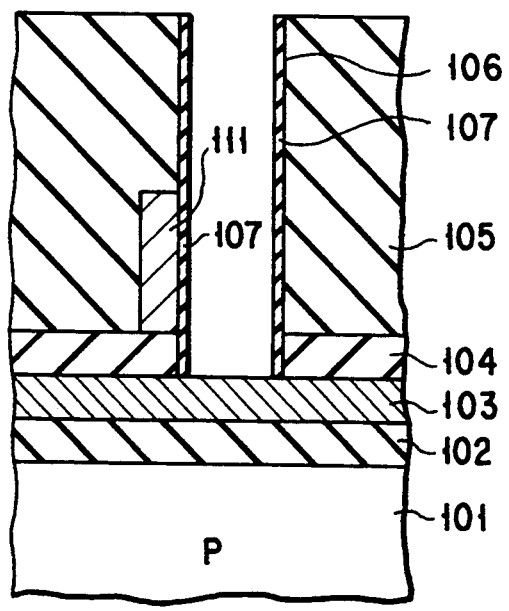
FIG. 27A is a sectional view illustrating steps subsequent to the steps of FIG. 26A.
Figure 27B:
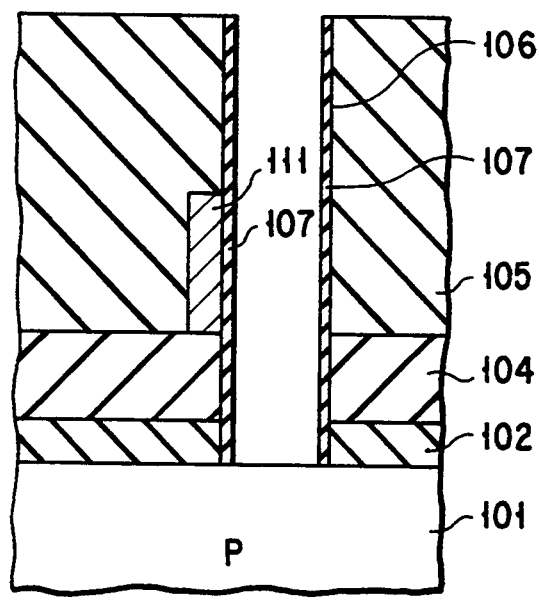
FIG. 27B is a sectional view illustrating steps subsequent to the steps of FIG. 26B.

As shown in FIGS. 27A and 27B, by means of masking and reactive ion etching techniques, the opening 106 is formed through the insulating layers 105, 104 and 102 to reach the substrate 101. At this point, a portion of the gate electrode 111 is also etched away. The bit line 103 is not attacked by an etchant used in this step and is thus left as it is as shown in FIG. 27A. The gate insulating layer 107 of the ONO structure is next formed on the inner wall of the opening 106 except its bottom.

As shown in FIGS. 28A and 28B, the source region or the drain region 108 of N-type monocrystalline silicon having an impurity concentration of about $1 \times 10^{20}$ impurities per cubic centimeter is next formed in the opening 106 by using selective epitaxial growth techniques. At this point, the region 108 is continued to grow until it top reaches the neighborhood of the lower end of the gate electrode 111. The source or drain region thus formed is electrically connected to the bit line 103 but isolated from the P-type substrate 101 by PN junction. The doping gas used in the selective epitaxial growth process is next changed from N-type to P-type to grow the channel region 109 of P-type monocrystalline silicon having an impurity concentration of about $1 \times 10^{16}$ impurities per cubic centimeter. The channel region 109 is continued to grow until its top reaches the neighborhood of the upper end of the gate electrode 111. Next, the doping gas is changed to N type to grow the drain region or the source region 110 of N-type monocrystalline silicon having an impurity concentration of about $1 \times 10^{20}$ impurities per cubic centimeter. The region 110 is continued to grow until it reaches the top of the opening 106.

As shown in FIGS. 29A and 29B, the insulating layer 105 and the gate insulating layer 107 are etched by 400 to 600 run to protrude the region 110. For example Ta$_2$O$_5$ is next deposited at an equivalent thickness of less than 3 nm to form the capacitor dielectric layer 112. A tungsten (W) layer is subsequently deposited, at a thickness of about 100 nm, on the dielectric layer by means of CVD and then patterned to form the plate electrode 113 of the data storage capacitor.

In this way, a DRAM cell is fabricated which has a capacitor composed of the plate electrode 113, the dielectric layer 112 and the storage electrode serving as the drain region or the source region 110 as well, a transfer gate composed of the region 110, the source region or the drain region 108, the channel region 109 and the gate electrode 111 serving as a word line as well, and the bit line 103.

In the manufacturing method illustrated in FIGS. 25A through 29A and FIGS. 25B through 29B, four masks are used to pattern the bit lines, the word lines, the openings, and the plate electrodes each overlying the entire surface of a memory cell. A small number of masks required permit the number of manufacturing steps to be reduced considerably, the manufacturing costs to be reduced and DRAMs to be manufactured at a high yield. In addition, the source, drain and channel regions of a transfer gate and the storage electrode of a capacitor can be formed by merely switching between doping gases in the selective epitaxial growth step performed once, permitting the number of manufacturing steps to be reduced considerably and hence DRAMs to be manufactured at low cost and high yield.

According to the present invention, as described above, semiconductor devices and methods of manufacture thereof which permit high-packing density and manufacture thereof at low cost and high yield can be provided.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a first insulating layer;
   a gate electrode layer formed on said first insulating layer;
   a second insulating layer formed on said gate electrode layer;
   an opening formed through said first insulating layer, said gate electrode layer and said second insulating layer;
   a gate insulating layer formed within said opening to overlay at least said gate electrode layer;
   a first semiconductor layer formed on said gate insulating layer to oppose said gate electrode layer within said opening;
   a second semiconductor layer formed within said opening so as to make contact with said first semiconductor layer and oppose said first insulating layer; and
   a third semiconductor layer formed within said opening so as to make contact with said first semiconductor layer and oppose said second insulating layer, each layer of said first, second and third semiconductor layers having a respective hollow post shape.

2. The semiconductor device according to claim 1, in which said first semiconductor layer contains impurities of a first conductivity type, and said second and third semiconductor layers contain impurities of a second conductivity type which is opposite to said first conductivity type.

3. The semiconductor device according to claim 1, in which said first semiconductor layer is made of an intrinsic semiconductor, and said second and third semiconductor layers contain impurities of the same conductivity type.

4. The semiconductor device according to claim 1, in which one of said second and third semiconductor layers is in contact with a semiconductor substrate.

5. The semiconductor device according to claim 1, in which said each of said first and second insulating layers contains impurities of the same conductivity type.

6. A semiconductor device comprising:
a first insulating layer;
a gate electrode layer formed on said first insulating layer;
a second insulating layer formed on said gate electrode layer;
an opening formed through said first insulating layer, said gate electrode layer and said second insulating layer;
a gate insulating layer formed within said opening to overlay at least said gate electrode layer;
a first semiconductor layer formed on said gate insulating layer to oppose said gate electrode layer within said opening;
a second semiconductor layer formed within said opening so as make contact with said first semiconductor layer and oppose said first insulating layer;
a third semiconductor layer formed within said opening so as to make contact with said first semiconductor layer and oppose said second insulating layer, each layer of said first, second and third semiconductor layers having a respective hollow post shape;
a bit line connected to one of said second and third semiconductor layers; and
a capacitor having an end connected to the other of said second and third semiconductor layers.

7. The semiconductor device according to claim 6, in which said first semiconductor layer contains impurities of a first conductivity type, and said second and third semiconductor layers contain impurities of a second conductivity type which is opposite to said first conductivity type.

8. The semiconductor device according to claim 6, in which said first semiconductor layer is made of an intrinsic semiconductor, and said second and third semiconductor layers contain impurities of the same conductivity type.

9. The semiconductor device according to claim 6, in which one of said second and third semiconductor layers is in contact with a semiconductor substrate.

* * * * *